(12) United States Patent
Den Hoedt

(10) Patent No.: US 12,417,894 B2
(45) Date of Patent: Sep. 16, 2025

(54) METHOD AND MANIPULATION DEVICE FOR HANDLING SAMPLES

(71) Applicant: DELMIC IP B.V., Delft (NL)

(72) Inventor: Sander Vincent Den Hoedt, Delft (NL)

(73) Assignee: DELMIC IP B.V., Delft (NL)

( * ) Notice: Subject to any disclaimer, the term of this patent is extended or adjusted under 35 U.S.C. 154(b) by 370 days.

(21) Appl. No.: 17/784,283

(22) PCT Filed: Dec. 11, 2020

(86) PCT No.: PCT/NL2020/050778
§ 371 (c)(1),
(2) Date: Jun. 10, 2022

(87) PCT Pub. No.: WO2021/118355
PCT Pub. Date: Jun. 17, 2021

(65) Prior Publication Data
US 2023/0045007 A1    Feb. 9, 2023

(30) Foreign Application Priority Data

Dec. 12, 2019  (NL) .................................... 2024445

(51) Int. Cl.
*H01J 37/20*  (2006.01)
*H01J 37/26*  (2006.01)

(52) U.S. Cl.
CPC ............ *H01J 37/20* (2013.01); *H01J 37/26* (2013.01); *H01J 2237/002* (2013.01); *H01J 2237/2001* (2013.01); *H01J 2237/208* (2013.01)

(58) Field of Classification Search
CPC ...... H01J 37/20; H01J 37/26; H01J 2237/002; H01J 2237/2001; H01J 2237/208; H01J 2237/26
See application file for complete search history.

(56) References Cited

U.S. PATENT DOCUMENTS

| 4,637,226 A | 1/1987 | Sitte |
| 8,754,384 B1 * | 6/2014 | Persoon .................. H01J 37/20 |
| | | 250/306 |

(Continued)

FOREIGN PATENT DOCUMENTS

| CN | 107643308 A | 1/2018 |
| JP | 10765769 A | 3/1995 |

(Continued)

OTHER PUBLICATIONS

Search Report from corresponding Dutch Application No. NL 2024445, Aug. 20, 2020.

(Continued)

*Primary Examiner* — David E Smith
*Assistant Examiner* — Christopher J Gassen
(74) *Attorney, Agent, or Firm* — Workman Nydegger

(57) ABSTRACT

An assembly is provided including a manipulation device and a cooling unit. The manipulation device includes a holder for samples and a thermal mass member which is arranged in thermal contact with the holder. The manipulation device is configured to place the manipulation device in a heat exchange position wherein the in thermal mass member is in thermal contact with the cooling unit, and to move the manipulation device from the heat exchange position to a manipulation position wherein the thermal mass member is thermally separated from the cooling unit. An inspection apparatus of focused ion beam apparatus is also provided including such an assembly, and a method of using such an assembly.

17 Claims, 5 Drawing Sheets

(56) References Cited

U.S. PATENT DOCUMENTS

| | | | |
|---|---|---|---|
| 2008/0121821 A1* | 5/2008 | Muka | H01L 21/67109 |
| | | | 165/80.4 |
| 2009/0000400 A1 | 1/2009 | Hayles et al. | |
| 2010/0236476 A1* | 9/2010 | De Jong | H01L 21/00 |
| | | | 414/217 |
| 2017/0062174 A1 | 3/2017 | Iwahori et al. | |
| 2017/0169991 A1* | 6/2017 | Remigy | G01N 1/42 |
| 2018/0024081 A1 | 1/2018 | Kogan et al. | |
| 2020/0141846 A1* | 5/2020 | Zandbergen | H01J 37/20 |
| 2021/0313139 A1* | 10/2021 | Maier | H01J 37/20 |

FOREIGN PATENT DOCUMENTS

| | | | | |
|---|---|---|---|---|
| WO | WO-2008013443 A2 * | 1/2008 | | G03F 7/70875 |
| WO | 2012138738 A2 | 10/2012 | | |

OTHER PUBLICATIONS

International Search Report from corresponding PCT Application No. PCT/NL2020/050779, Mar. 18, 2021.

Chinese Notification to Grant Patent Right for Invention from Corresponding Chinese Patent Application No. CN202080085780.8, Oct. 28, 2024.

* cited by examiner

METHOD AND MANIPULATION DEVICE FOR HANDLING SAMPLES

BACKGROUND

The invention relates to a manipulation device for handling samples, in particularly for cryogenic samples. Furthermore, the invention relates to a method for handling samples, in particularly for handling cryogenic samples.

Manipulation devices for handling cryogenic samples are known in the art. Such devices are for example used for handling small and fragile samples at cryogenic temperatures, for example for studying them in an inspection apparatus, such as an electron microscope.

For studying samples at cryogenic temperatures in an electron microscope, the used manipulators need to be cooled in order to ensure that the sample is maintained at said cryogenic temperature, at least during the time the sample is studied. Such samples cannot be handled with manipulators which are at room temperature, as this would immediately heat up and devitrify (i.e. ruin) the sample.

While the samples and manipulators can be cooled through immersion into a cryogenic liquid, such as liquid nitrogen, this requires the use of a separate, isolated cooling chamber to prevent released nitrogen gas from contaminating and/or compromising a vacuum in the inspection apparatus, in particular, in the electron microscope.

In order to ensure that the sample is maintained at the desired cold temperature, the manipulation device can instead comprise a sample holding unit which is connected to a cooling unit. The cooling unit is configured for actively cooling the sample holding unit, preferably for actively cooling the sample holding unit to cryogenic temperatures.

In order to provide an active cooling of the sample holding unit, US 2009/0000400 A1 describes an apparatus wherein the sample holding unit is connected to a cooling unit or heat sink via heat transfer member, such as a braid comprising heat conducting material. The active cooling by the cooling unit or heat sink via the braid, can ensure that the surface that is touching the cryogenic specimen is cold. The braid should preferably not be made very long, as a longer braid represents a higher heat load.

SUMMARY OF THE INVENTION

A disadvantage of using a braid is that it limits the freedom of movement of the manipulation device.

It is an object of the present invention to at least partially obviate at least one of the disadvantages of the common manipulators for cryogenic applications.

According to a first aspect, the present invention provides an assembly comprising a manipulation device and a cooling unit,
  wherein the manipulation device comprises a holder for samples and a thermal mass member which is arranged in thermal contact with the holder,
  wherein the manipulation device is configured to position the manipulation device in a heat exchange position wherein the in thermal mass member is in thermal contact with the cooling unit, and to move the manipulation device from the heat exchange position to a manipulation position wherein the thermal mass member is thermally separated from the cooling unit.

In the assembly of the present invention, the manipulation device, in particular the holder for samples is separated from the cooling unit when the manipulation device is in or moved to the manipulation position. Accordingly, the manipulation device can move substantially feely, because the manipulation device is not connected to the cooling unit by means of a heat transfer member at least when it is in or moved to the manipulation position. Due to the thermal mass member, which is preferably fixedly connected to the holder, an increase in temperature of the holder is at least reduced, preferably is substantially prevented, when the holder is thermally separated from the cooling unit, for example when handling a sample. Due to the thermal mass member, a braid for connecting the holder with the cooling unit can be omitted.

When handling a cryogenic sample, the holder also needs to be at a cryogenic temperature in order to at least substantially prevent that the sample is heated up by the holder. It is noted that an increase of the temperature of a cryogenic sample is acceptable as long as the temperature stays below a temperature which may induce a morphology change of the sample. For example, for the vitrification of biological samples for electron microscopy, the specimen is frozen by rapid cooling which instantly fixes the cell in an amorphous, glass-like phase, in which all cellular components are kept in a close-to-life state. If the cooling rate during vitrification is too low or the sample is heated up, irreversible phase transition of water into cubic or hexagonal ice will occur and destroy the sample. Such a phase transition may occur already at −140 degrees Celsius.

Accordingly, by positioning the manipulation device in the heat exchange position, the thermal mass member is in thermal contact with the cooling unit, and accordingly the cooling unit can actively cool the thermal mass member and also the holder which is in thermal contact with the thermal mass member. After the holder and the thermal mass member have been cooled down to a desired temperature, for example down to a cryogenic temperature, the manipulation device is ready for handling a cryogenic sample. Accordingly, the manipulation device can be moved to a manipulation position in which the thermal mass member is thermally separated from the cooling unit, and wherein the manipulation device can freely move for handling and/or holding the cryogenic sample using the holder.

Preferably, the thermal mass member, in particular the thermal capacity of the thermal mass member, is configured to substantially maintain the low temperature of the holder, when the holder is thermally separated from the cooling unit.

In an embodiment, the thermal mass member comprises a first heat transfer surface, and the cooling unit comprises a second heat transfer surface, wherein the assembly is configured such that in the heat exchange position the first heat transfer surface is arranged in thermal contact with the second heat transfer surface. Preferably the first and second heat transfer surface are configured to provide a heat transfer between the cooling unit and the thermal mass member. In an embodiment, the first heat transfer surface is configured to abut against the second heat transfer surface, when the manipulation device is in the heat exchange position.

In an embodiment, the manipulation device comprises one or more actuators for moving the holder, and a thermal insulating member, wherein the thermal insulating member is arranged between the one or more actuators and the holder. Due to the use of the thermal insulating member it is at least substantially prevented that the one or more actuators are also cooled by the cooling unit.

In an embodiment, the thermal mass member is arranged between the thermal insulating member and the holder. Preferably, the thermal insulating member is arranged directly adjacent to the thermal mass member. Accordingly, the thermal insulating member limits the part of the manipulation device that are cooled down by the cooling unit, when the manipulation device is in the heat exchange position, substantially to the thermal mass member and the holder.

In an embodiment, the thermal mass member comprises a cavity which is at least partially filled with a phase change material. In an embodiment, the phase change material comprises a phase change at a predetermined low temperature suitable for substantially preventing a change in morphology of the sample or a sample surrounding material. A phase change material can store a large amount of heat energy during a phase change, such as from a solid to a liquid. Advantageously, large quantities of thermal energy can be stored at a relatively constant temperature where the phase change occurs. Thus the use of a phase change material can provide temperature stabilization by storing large amounts of thermal energy without significantly changing the temperature.

In an embodiment, the phase change material comprises a phase change from solid to liquid at said predetermined low temperature. In a phase change from solid to liquid the volume of the phase change material will not change to a large extent, and accordingly, there is only a relatively low pressure buildup in the cavity due to such a phase change.

In an embodiment where the sample comprises water which is frozen to ice at cryogenic temperatures, the phase change material comprises a phase change at a temperature below a point where the morphology of ice changes, preferably below −140 degrees Celsius. In an embodiment, the morphology of ice changes from an amorphous form to a cubic crystallization form. Such a change in morphology of the ice, for example from amorphous ice to cubic crystallized ice may destroy the sample, and such a change in morphology needs to be prevented as much as possible.

According to a second aspect, the present invention provides an inspection system and/or a focused ion beam system, wherein the microscope system comprises a sample compartment which is configured to substantially enclose a sample, wherein the sample compartment comprises an assembly as described above, wherein the assembly is at least partially arranged inside the sample compartment.

The assembly of the invention as described above is in particular advantageous for use in an inspection system and/or a focused ion beam system. In particular for handling small samples in an electron microscope, the manipulators are small and can therefor only carry a limited load. In case braids used for connecting the manipulator to a cooling unit, such as a cold finger or heat sink, these braids are relatively stiff and therefor limit the load bearing capacity of the manipulator. These braids furthermore severely limit the degrees of freedom and the total range of motion of the manipulator. Due to the thermal mass member of the manipulator of the present invention, the braid for connecting the holder with the cooling unit can be omitted, and the limitations in the freedom to move the manipulator are removed.

In an embodiment, the cooling unit is arranged against or in a wall of the sample compartment. Preferably the cooling unit is arranged at a position in the sample compartment such that the thermal mass member can occasionally interface with the cooling unit, and preferably such that the position of the cooling unit does not interfere with the movement of the manipulator when handling and/or moving a sample in the sample compartment.

In an embodiment, the system comprises a sample holding unit, wherein the cooling unit is connected to the sample holding unit or wherein the cooling unit is an integral part of the sample holding unit. Accordingly, the system only requires one cooling unit for the cooling of both the sample in the sample holding unit and the thermal mass member of the manipulation device.

In an embodiment, the inspection system comprises an electron microscope.

In an embodiment, the sample compartment comprises a vacuum chamber.

According to a third aspect, the present invention provides a method for using an assembly comprising a manipulation device and a cooling unit, wherein the manipulation device comprises a holder for samples and a thermal mass member which is arranged in thermal contact with the holder, wherein the method comprises the steps of:
  arranging the manipulation device in a heat exchange position in which the thermal mass member is in thermal contact with the cooling unit, and
  moving the manipulation device from the heat exchange position to a manipulation position in which manipulation position the thermal mass member is thermally separated from the cooling unit.

In an embodiment, the thermal mass member comprises a first heat transfer surface, and the cooling unit comprises a second heat transfer surface, wherein the first heat transfer surface is positioned in thermal contact with the second heat transfer surface, when the assembly is in the heat exchange position.

In an embodiment, the first heat transfer surface abuts against the second heat transfer surface, when the manipulation device is in the heat exchange position.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
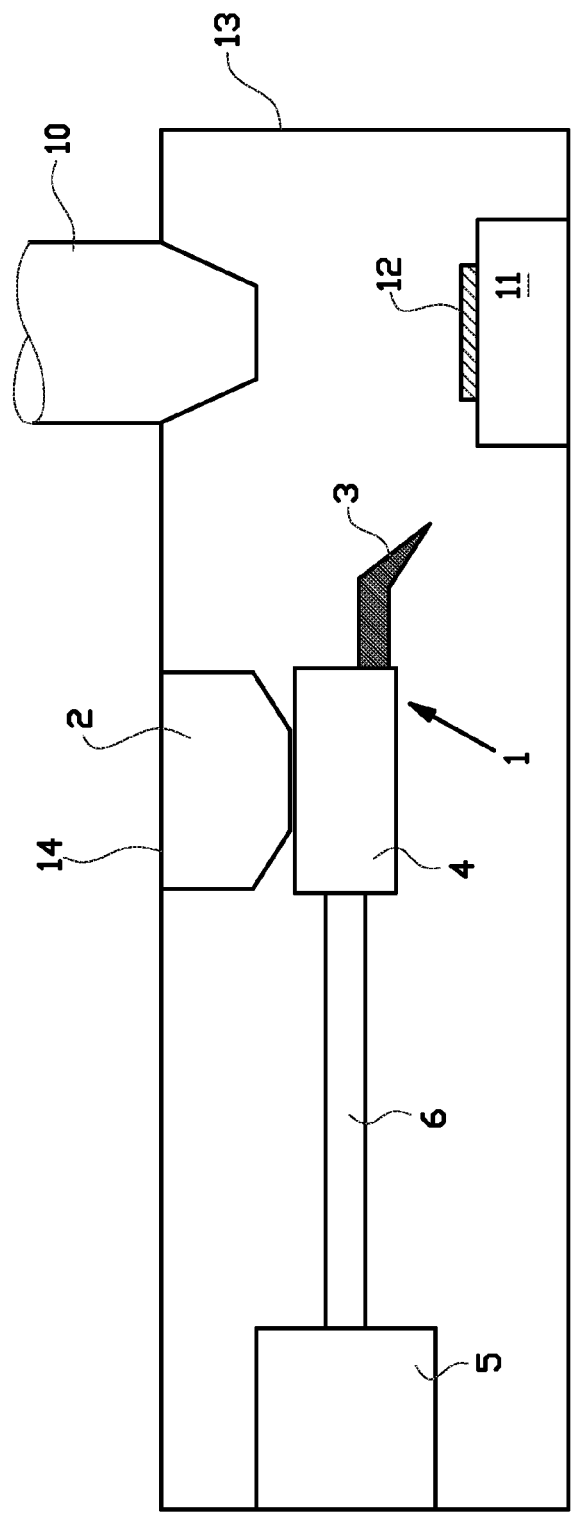
FIG. 1 schematically shows a first example of an assembly of the present invention in the heat exchange position,
  FIG. 2 schematically shows the assembly of FIG. 1 in a manipulation position,
  FIGS. 3A and 3B schematically show various side views of a second example of an assembly according to the present invention, and
  FIG. 4 schematically shows a third example of an assembly according to the present invention.

FIG. 1 schematically shows an assembly comprising a manipulation device 1 and a cooling unit 2. The manipulation device 1 comprises a holder 3 for samples and a thermal mass member 4 which is arranged in thermal contact with the holder 3. In this example, the holder 3 is configure as a pair of tweezers, however other known holders for holding or manipulating a sample or a part thereof can also be applied in the manipulation device 1. The thermal mass member is fixedly connected to the holder.

The manipulation device 1 comprises one or more actuators 5 for moving the holder 3, and an arm 6. The arm 6 is arranged between the one or more actuators 5 and the holder 3. Preferably the arm 6 comprises a thermal insulating member which allows to thermally insulate the holder 3 from the one or more actuators 5. In particular, the thermal mass member 4 is arranged between the arm 6 and the holder 3. As schematically shown in FIG. 1, the arm 6 is arranged directly adjacent to the thermal mass member 4.

In the present example, the thermal mass member 4 is made of a material with a high heat capacity. It turns out that the thermal mass member 4 can be made out of a large variety of materials. The most important factor is that the thermal conductivity of the material. This thermal conductivity needs to be high enough to ensure the cooling down of the thermal mass member 4 down to the cryogenic temperatures within a reasonable short time duration. Preferably the thermal mass member 4 is at least partially made from metal material, such as copper or aluminum, have both a high heat capacity and a high thermal conductivity.

The thermal mass member 4 comprises a first heat transfer surface 41, and the cooling unit 2 comprises a second heat transfer surface 21. The assembly is configured such that in the heat exchange position the first heat transfer surface 41 is arranged in thermal contact with the second heat transfer surface 21, as schematically shown in FIG. 1. In this position, the first heat transfer surface 41 and second heat transfer surface 21 are configured to provide a heat transfer between the cooling unit 2 and the thermal mass member 4. In the example of FIG. 1, the first heat transfer surface 41 abuts against the second heat transfer surface 21, when the manipulation device 1 is in the heat exchange position.

When the manipulation device 1 in the heat exchange position of FIG. 1, the thermal mass member 4 is in thermal contact with the cooling unit 2, and the cooling unit 2 can actively cool the thermal mass member 4 and also the holder 3 which is in thermal contact with the thermal mass member 4. After the holder 3 and the thermal mass member 4 have been cooled down to a desired temperature, for example down to a cryogenic temperature, the manipulation device 1 is ready for handling a cryogenic sample.

Figure 2:
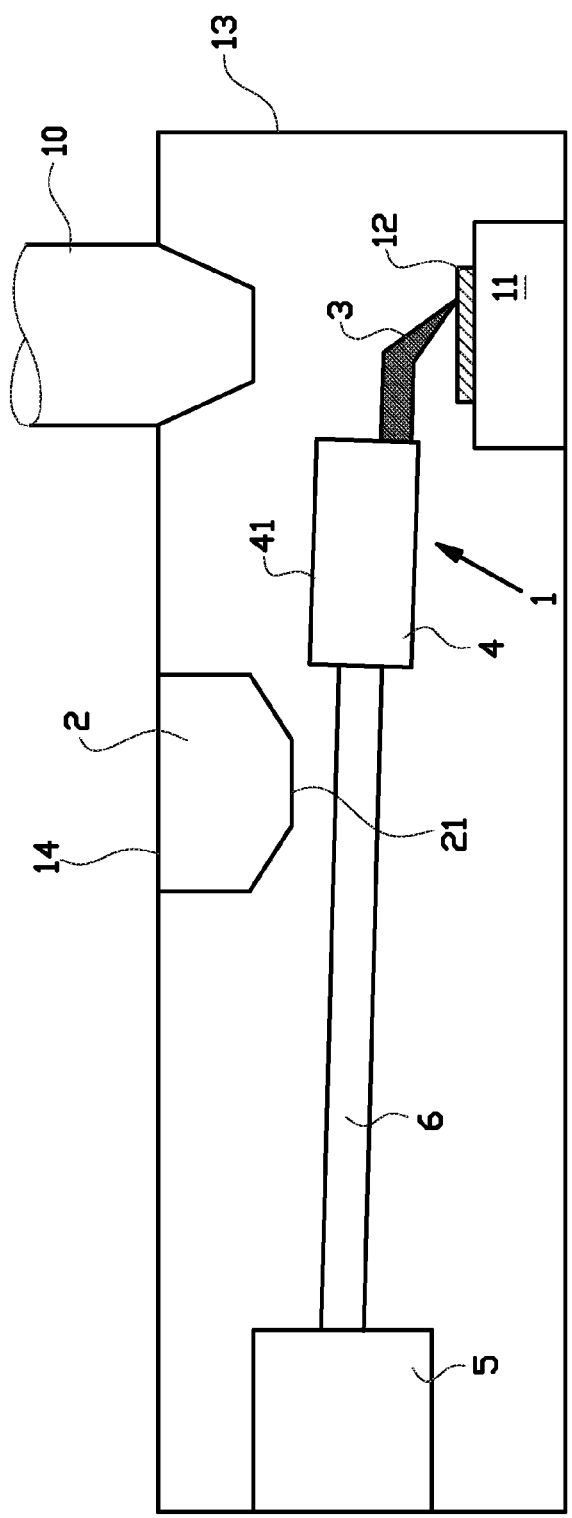

Accordingly, the manipulation device 1 can be moved to a manipulation position, as schematically shown in FIG. 2. When the manipulation device 1 is moved away from the heat exchange position to the manipulation position, the thermal mass member 4 is thermally separated from the cooling unit 2, and the manipulation device 1 can substantially freely move for handling and/or holding the cryogenic sample 12 using the holder 3.

As shown in FIG. 2, when the manipulation device 1 is moved away from the cooling unit 2 and/or is moved to or is in a manipulation position, the manipulation device 1, in particular the holder 3 for samples is separated from the cooling unit 2. Accordingly, the manipulation device 1 can move substantially freely, because the manipulation device 1 is not connected to the cooling unit 2 by means of a heat transfer member, such as a braid. Due to the thermal mass member 4, an increase in temperature of the holder 3 is at least reduced, preferably is substantially prevented, when the holder 3 is thermally separated from the cooling unit 2, for example, when handling a sample. Due to the thermal mass member 4, a braid for thermally connecting the holder 3 with the cooling unit 2 can be omitted.

FIGS. 1 and 2 also schematically show an inspection system and/or a focused ion beam system 10, with a sample holder 11. The system comprises a sample compartment 13 which is configured to substantially enclose a sample 12. The assembly is at least partially arranged inside the sample compartment 13.

In the example shown in FIGS. 1 and 2, the cooling unit 2 is arranged against or in a wall 14 of the sample compartment 13. The cooling unit 2 is arranged at a position in the sample compartment 13 such that the thermal mass member 4 can occasionally interface with the cooling unit 2, as shown in FIG. 1.

An example of an inspection system, is an electron microscope. Such an electron microscope may be provided with a focused ion beam system for machining the sample 12. In case the inspection system is an electron microscope, the sample compartment 13 is preferably a vacuum chamber.

When using the assembly of the invention, such a method comprises the steps of:
    arranging the manipulation device 1 in a heat exchange position of FIG. 1, in which the thermal mass member 4 is in thermal contact with the cooling unit 2,
    cooling down the thermal mass member 4 to a desired temperature or during at least a predetermined time, and
    moving the manipulation device 1 from the heat exchange position of FIG. 1 to a manipulation position of FIG. 2, in which manipulation position the thermal mass member 4 is thermally separated from the cooling unit 2.

Figure 3A:
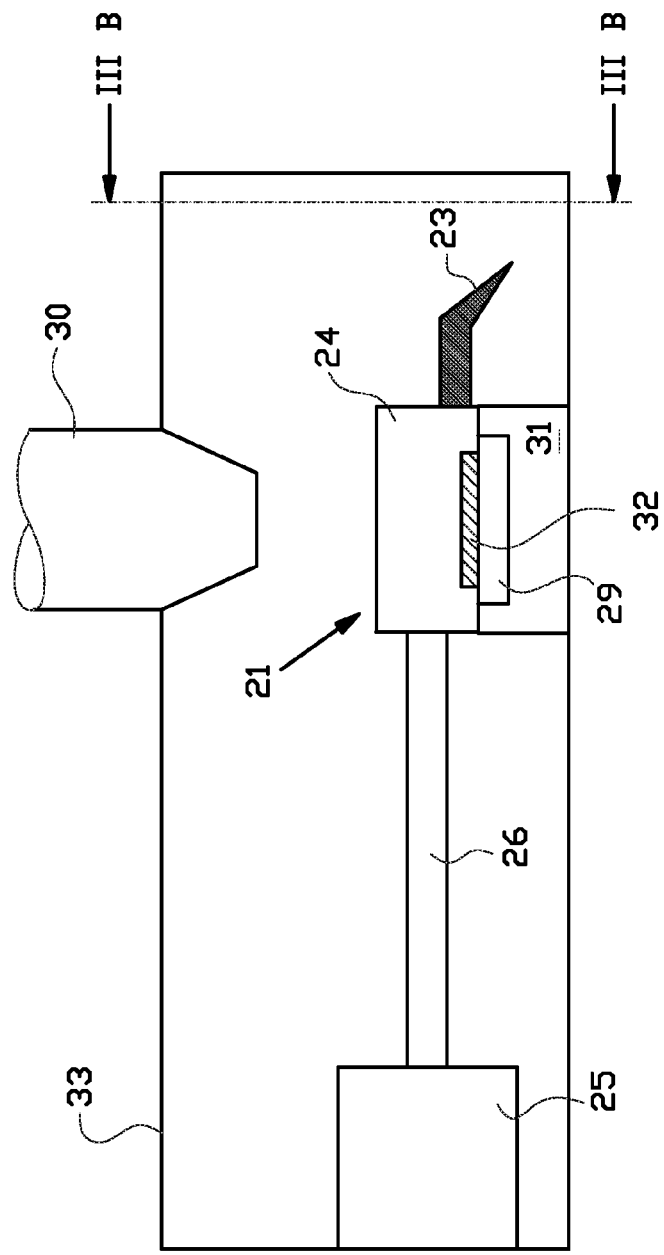
Figure 3B:
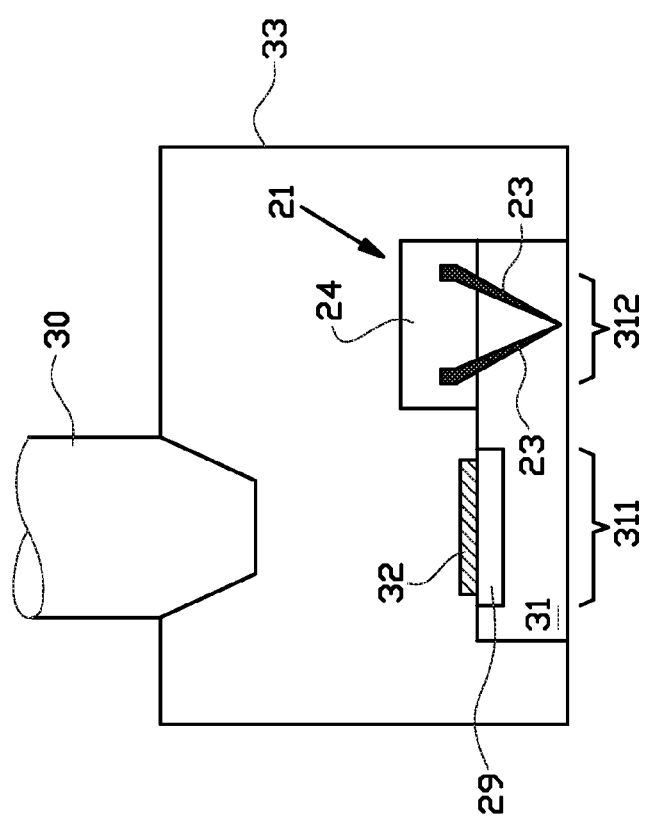

FIGS. 3A and 3B schematically show various side views of a second example of an assembly according to the present invention. The assembly comprises a manipulation device 21 and a cooling unit 31. The cooling unit 31 comprises a first part 311 which comprises a sample holding unit 29, and a second part 312 which is configured for cooling the thermal mass member 24 of the manipulation device 21. Preferably, the sample holding unit 29 is an integral part of the cooling unit 31.

Again, the manipulation device 21 comprises a holder 23 for samples and a thermal mass member 24 which is arranged in thermal contact with the holder 23. The manipulation device 21 comprises one or more actuators 25 for moving the holder 23, and an arm 26. The arm 26 is arranged between the one or more actuators 25 and the holder 23, and comprises a thermal insulating member which allows to thermally insulate the holder 23 from the one or more actuators 25.

FIGS. 3A and 3B also schematically show an inspection system and/or a focused ion beam system 30, which are configured for inspecting and/or processing a sample 32 on the sample holding unit 29. The system further comprises a sample compartment 33 which is configured to substantially enclose the sample 32. The assembly is at least partially arranged inside the sample compartment 33. The cooling unit 31 is arranged at a position in the sample compartment 33 such that the thermal mass member 24 can occasionally interface with the cooling unit 31, in particular the second part 312 thereof, as shown in FIG. 3B.

Figure 4:
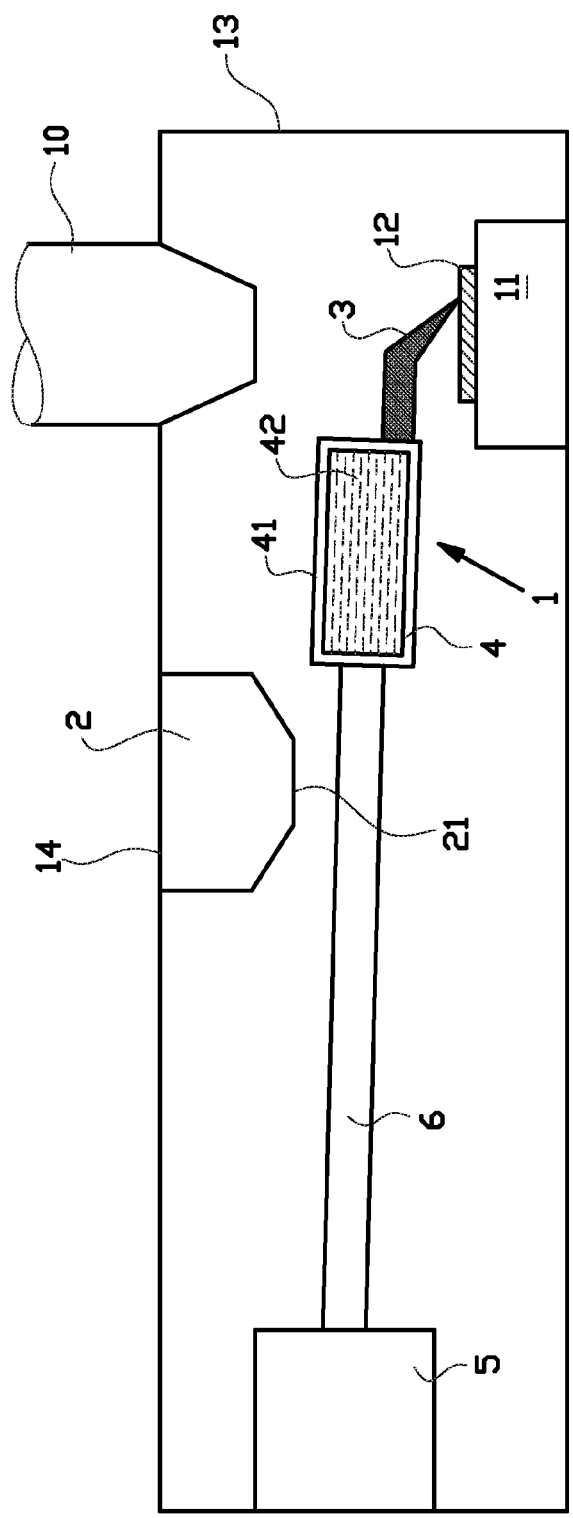

FIG. 4 schematically shows a third example of an assembly according to the present invention. The system as shown in FIG. 4 is largely the same as the system described in the first example above with reference to FIGS. 1 and 2. Accordingly in FIGS. 1, 2 and 4 the same features are provided with the same reference numbers.

The third example as shown in FIG. 4 differs from the first example, in that the thermal mass member 4 comprises a cavity 42 which is at least partially filled with a phase change material, for example with isopentane. A phase change material can store a large amount of heat energy during a phase change, such as from a solid to a liquid. Advantageously, large quantities of thermal energy can be stored at a relatively constant temperature where the phase change occurs. Thus the use of a phase change material in the cavity 42 of the thermal mass member 4 can provide temperature stabilization by storing large amounts of thermal energy without significantly changing the temperature.

As schematically indicated, the cavity 42 is preferably completely encloses the phase change material so that no phase change material can escape out of the cavity 42 into the sample compartment 13

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. An assembly comprising:
   a manipulation device; and
   a cooling unit,
   wherein the manipulation device comprises a holder for samples and a thermal mass member which is arranged in thermal contact with the holder, wherein the thermal mass member is fixedly connected to the holder for samples,
   wherein the manipulation device is configured to place the manipulation device in a heat exchange position wherein the thermal mass member is in thermal contact with the cooling unit, and to move the manipulation device from the heat exchange position to a manipulation position wherein the thermal mass member is thermally separated from the cooling unit,
   wherein the thermal mass member comprises a first heat transfer surface, and the cooling unit comprises a second heat transfer surface, wherein the first heat transfer surface and the second heat transfer surface are solid,
   wherein the assembly is configured such that in the heat exchange position, the first heat transfer surface is configured to abut against the second heat transfer surface, such that the first heat transfer surface is arranged in thermal contact with the second heat transfer surface.

2. The assembly according to claim 1, wherein a thermal capacity of the thermal mass member is configured to substantially maintain a temperature of the holder for a period of time during a manipulation of the samples at the manipulation position.

3. The assembly according to claim 1, wherein the manipulation device comprises one or more actuators for moving the holder, and a thermal insulating member, wherein the thermal insulating member is arranged between the one or more actuators and the holder.

4. The assembly according to claim 3, wherein the thermal mass member is arranged between the thermal insulating member and the holder.

5. The assembly according to claim 1, wherein the thermal mass member comprises a cavity which is at least partially filled with a phase change material,
   wherein the phase change material is configured to change phase at a predetermined temperature suitable for substantially preventing a change in morphology of one or more of the samples or a sample surrounding material.

6. The assembly according to claim 5, wherein the phase change material is configured to change phase from solid to liquid at said predetermined temperature.

7. The assembly according to claim 5, wherein the cavity is configured to enclose the phase change material.

8. The assembly according to claim 5, wherein the phase change material is configured to change phase from solid to liquid at said predetermined temperature, and wherein the phase change material is configured to change phase at a temperature below a point where the morphology of ice changes.

9. An inspection system and/or a focused ion beam system, wherein the system comprises a sample compartment which is configured to substantially enclose a sample,
   wherein the sample compartment comprises an assembly that comprises:
   a manipulation device; and
   a cooling unit,
   wherein the manipulation device comprises a holder for samples and a thermal mass member which is arranged in thermal contact with the holder, wherein the thermal mass member is fixedly connected to the holder for samples
   wherein the manipulation device is configured to place the manipulation device in a heat exchange position wherein the thermal mass member is in thermal contact with the cooling unit, and to move the manipulation device from the heat exchange position to a manipulation position wherein the thermal mass member is thermally separated from the cooling unit,
   wherein the thermal mass member comprises a first heat transfer surface, and the cooling unit comprises a second heat transfer surface, wherein the first heat transfer surface and the second heat transfer surface are solid,
   wherein the assembly is configured such that in the heat exchange position, the first heat transfer surface is configured to abut against the second heat transfer surface, such that the first heat transfer surface is arranged in thermal contact with the second heat transfer surface,
   wherein the assembly is at least partially arranged inside the sample compartment, and
   wherein the second heat transfer surface is arranged inside the sample compartment.

10. The inspection system and/or focused ion beam system according to claim 9, wherein the cooling unit is arranged against or in a wall of the sample compartment.

11. The inspection system and/or focused ion beam system according to claim 9, wherein the system comprises a sample holding unit.

12. The inspection system and/or focused ion beam system according to claim 11, wherein the cooling unit is connected to the sample holding unit.

13. The inspection system and/or focused ion beam system according to claim 11, wherein the cooling unit is an integral part of the sample holding unit.

14. The inspection system and/or focused ion beam system according to claim 9, wherein the system comprises an electron microscope.

15. The inspection system and/or focused ion beam system according to claim 9, wherein the sample compartment comprises a vacuum chamber.

16. A method comprising the steps of:
    providing an assembly that comprises:
    a manipulation device; and
    a cooling unit,
    wherein the manipulation device comprises a holder for samples and a thermal mass member which is arranged in thermal contact with the holder, wherein the thermal mass member is fixedly connected to the holder for samples,
    wherein the manipulation device is configured to place the manipulation device in a heat exchange position wherein the thermal mass member is in thermal contact with the cooling unit, and to move the manipulation device from the heat exchange position to a manipulation position wherein the thermal mass member is thermally separated from the cooling unit, wherein the thermal mass member comprises a first heat transfer surface, and the cooling unit comprises a second heat transfer surface, wherein the first heat transfer surface and the second heat transfer surface are solid, wherein the assembly is configured such that in the heat exchange position, the first heat transfer surface is configured to abut against the second heat transfer surface, such that the first heat transfer surface is arranged in thermal contact with the second heat transfer surface;

arranging the manipulation device in a heat exchange position in which the first heat transfer surface is configured to abut against the second heat transfer surface and the thermal mass member is in thermal contact with the cooling unit at least via said first and second heat transfer surfaces; and moving the manipulation device from the heat exchange position to a manipulation position in which the thermal mass member is thermally separated from the cooling unit.

17. The method according to claim 16, wherein the thermal mass member comprises a cavity which is at least partially filled with a phase change material, wherein the phase change material is configured to change phase at a predetermined temperature suitable for substantially preventing a change in morphology of a sample or a sample surrounding material, wherein the method comprises the step of:

cooling the second heat transfer surface to a temperature at or below said predetermined temperature.

\* \* \* \* \*